United States Patent [19]

Huussen et al.

[11] Patent Number: 5,662,470
[45] Date of Patent: Sep. 2, 1997

[54] VERTICAL FURNACE

[75] Inventors: Frank Huussen, Bilthoven; Gerard Berenpas, Zuidwolde; Albert Hasper, Meppel; Chris G.M. De Ridder, Hoogland, all of Netherlands

[73] Assignee: ASM International N.V., Bilthoven, Netherlands

[21] Appl. No.: 414,294

[22] Filed: Mar. 31, 1995

[51] Int. Cl.⁶ .................................................. F27D 3/12
[52] U.S. Cl. .............................. 432/241; 432/5; 432/6; 432/253; 219/390
[58] Field of Search .................................. 432/241, 250, 432/253, 205, 5, 6, 11, 152; 219/390, 392, 416, 418; 414/172; 373/128, 130

[56] References Cited

U.S. PATENT DOCUMENTS

| | | | |
|---|---|---|---|
| 3,732,068 | 5/1973 | Larker | 432/205 |
| 4,778,382 | 10/1988 | Sakashita | 432/253 |
| 4,867,848 | 9/1989 | Cordier et al. | 373/6 |
| 5,226,812 | 7/1993 | Sakata | 432/253 |
| 5,329,095 | 7/1994 | Okase | 219/390 |
| 5,332,557 | 7/1994 | Sahoda et al. | 392/418 |
| 5,516,283 | 5/1996 | Schrems | 432/152 |

Primary Examiner—Henry A. Bennett
Assistant Examiner—Gregory Wilson
Attorney, Agent, or Firm—Young & Thompson

[57] ABSTRACT

A vertical furnace for processing wavers positioned on a support structure. The furnace comprises an inner sleeve, heating means and an outer sleeve. To support the inner sleeve on the support structure a support sleeve is provided engaging with its top and lower part of the inner sleeve and resting with its lower end on the support structure.

11 Claims, 2 Drawing Sheets

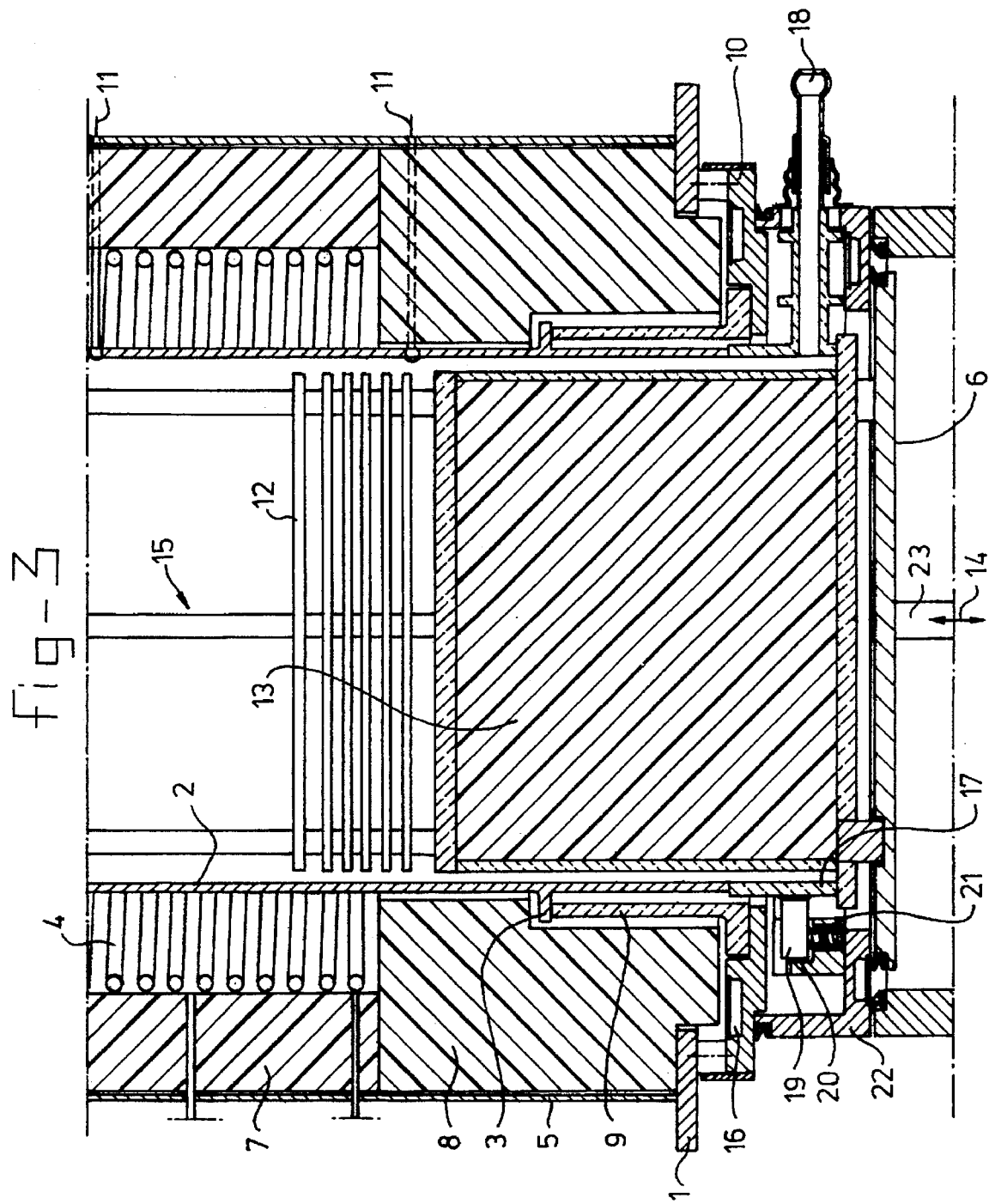

VERTICAL FURNACE

BACKGROUND OF THE INVENTION

1. Field of the Invention

The invention relates to a vertical furnace for processing wafers. Such a treatment has to be realized on a relatively high temperature with a relatively large accuracy of the temperature in a controlled gas atmosphere.

2. Description of the Related Art

Recent requirements to processing of such wafers require a relatively high temperature. In the art vertical furnaces are known, which can either be used stand alone or in combination with a cluster. Such a furnace comprises an inner sleeve heating coils insulation and an outer sleeve. Usually the inner sleeve is made of a quartz material which bears on a support structure. In most cases this support structure is cooled.

However, at increasing the temperature in the furnace, e.g. to about 1250° C. the quartz material will deglaze and degrade. Because of that radiation of the heating elements provided around the inner sleeve will not be transmitted through this sleeve so that insufficient heating of the wafers result. Furthermore, the material becomes brittle and can easily break.

Other ceramic materials are known in the art which are resistant to higher temperatures without degrading transmission properties. E.g. silicon carbide can be used to that end.

However, the heat conductivity of such materials is relatively high so that a considerable part of the heat generated in the heating zone will get lost to the support structure. Furthermore such ceramic materials being resistant to a relatively high temperature have a relatively high coefficient of expansion.

SUMMARY OF THE INVENTION

The invention aims to provide a furnace to be used at a relatively high temperature, such as above 1200° C. and wherein the loss of heat from the inner sleeve to the support structure is minimized.

According to one aspect the subject invention relates to a vertical furnace for processing wafers, a furnace being mounted on a support structure and comprising an inner sleeve having a removable lid either on its lower end or its upper end, wherein the other end is provided with closing means, electrical heating means surrounding said inner sleeve, insulation surrounding both the heating means and the inner sleeve and an outer sleeve, the inner sleeve comprising a material being resistant to temperatures of at least 1200° C. and provided with connecting means to engage the upper part of a support sleeve arranged around the inner sleeve at a lower end of the inner sleeve, the lower part of said support sleeve resting on said support structure.

According to a further aspect of the invention the inner sleeve comprises a SiC material.

The support sleeve preferably comprises a quartz material.

The support structure preferably is a cooled support plate.

According to a further aspect a receiving member for the wafers to be processed is provided inside the inner sleeve, said receiving member being displacable in vertical direction for loading/unloading of said wavers.

Such a receiving member can comprise one or more heat shields.

The lower end of the inner sleeve is preferably supported by a collar preferably comprising a quartz material.

According a further aspect of the invention means are provided to compensate for different expansion between material of the inner sleeve probably together with the collar and the material of the support sleeve such that tightness of the furnace can be guaranteed.

BRIEF DESCRIPTION OF THE DRAWINGS

A preferred embodiment of the invention will be shown in further detail referring to the enclosed drawing, in which:

FIG. 3 shows a detail of FIG. 1.

DESCRIPTION OF THE PREFERRED EMBODIMENT

Figure 1:
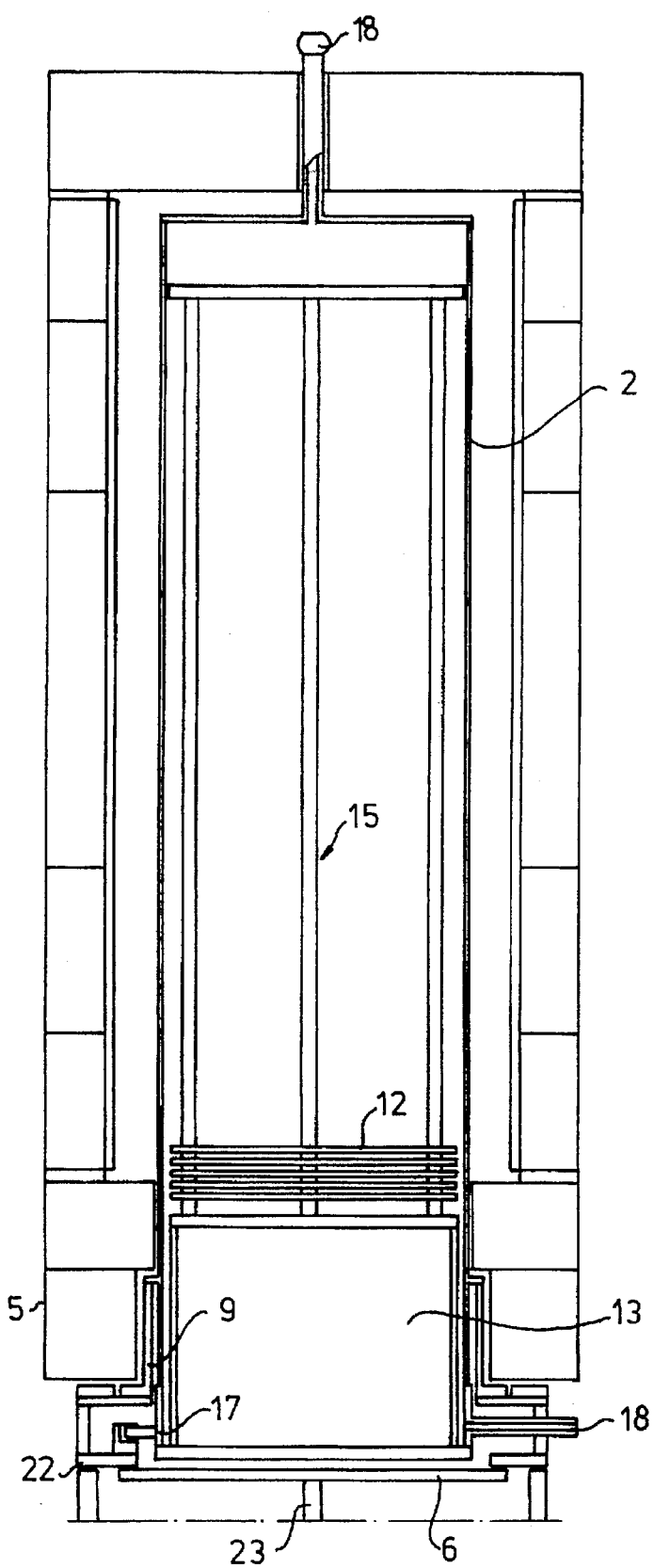
FIG. 1 shows an elevation of the furnace of the invention.
Figure 2:
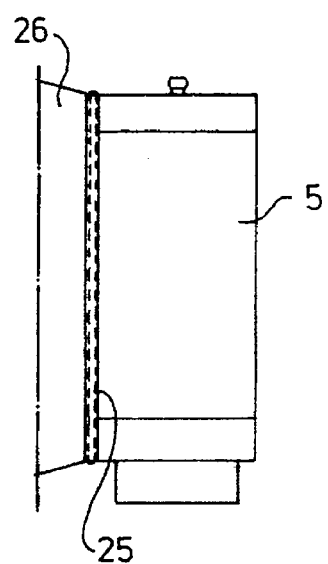
FIG. 2 shows the suspension of the furnace according to FIG. 1.

The furnace shown in the drawings has an upper part which is permanently closed and realized according to the art. This furnace can be part of the cluster device according to U.S. Pat. No. 5,294,572. This specification is incorporated by reference herein.

Generally such a furnace comprises an inner sleeve 2, heating elements 4 (one shown in FIG. 3), insulation 7, 8 as well as an outer water cooled sleeve 5. This support plate 10 is usually a metallic plate having one or more cooling ducts 16. In order to make this furnace suitable for a relatively high temperature, such as 1250° C., the inner sleeve 2 is realized from an SiC material which on the one hand has a good resistance against high temperatures and on the other hand does not decrease in its heat transmitting properties at elevated temperatures, as quartz material usually does.

Because SiC is a relatively good heat conductor problems might arise in maintaining an elevated temperature if the inner sleeve 2 would be directly posed on the cooled support plate 10.

To obviate this problem according to the invention it is proposed to provided a support sleeve 9. This support sleeve 9 is positioned around inner sleeve 2 and supports it through support projection 3 which can be arranged on an inner sleeve 2. Although the support sleeve must be able to withstand high temperatures these temperatures are substantially lower than the temperatures to which the inner sleeve 2 is subjected. This means that the support sleeve can be realized from a more insulating material than SiC material from which inner sleeve 2 is produced. For example, support sleeve 9 can comprise a quartz material. Because at lower temperature deglazing is not essential for such a support sleeve.

The position of the support projections has to be chosen such as on the one hand the length of support sleeve 9 is not too large which will result in overheating of support sleeve 9 but on the other hand the support projections should not be arranged too low because otherwise the heat loss through inner sleeve 2 will be unacceptable.

The support sleeve will transmit the weight of sleeve 2 to support plate 10.

To provide a sealing between the lower end of sleeve 2 and lid 6, a collar 17 is provided. Because the relatively low temperature at the lower end of the furnace this collar 17 can comprise a quartz material. To compensate for different elongation, collar 17 is not directly mounted to support plate 10, but is received through projections 19 in space 20 and put under a resilient force through spring 21. Space 20 is provided in part 22 which is sealed both with regard to the support plate 10 and the lower part of lid 6 to compensate for different expansion because of heating.

Lid 6 is connected to the elevator shaft 23 which makes it possible to move lid 6 (together with parts 13,12 and 15) in the directions of arrow 14. Above the insulation block a number of annular heat shields 12 is provided.

Conduit means 18 are provided to exhaust or introduce gasses inside the vertical furnace.

Thermocouples 11 are provided to measure and/or control the temperature inside the furnace.

During tests it revealed that it is possible to maintain the temperature of 1250° C. plus or minus 0.5° C. within the furnace. Even after longer use of the furnace both the inner sleeve and the support sleeve did not change in their properties.

Although the furnace is shown as standing alone it is possible to introduce it in a cluster such as is shown in U.S. Pat. No. 5,294,572.

Although the invention as described above is referring to the most preferred embodiment of the invention it has to be understood that it is possible to introduce alternatives to the several parts mentioned being obvious for the person skilled in the art and within the range of the appended claims.

We claim:

1. A vertical furnace for processing wafers, said furnace being mounted on a support structure and comprising an inner sleeve having a removable lid either on its lower end or its upper end, wherein the other end is provided with closing means, electrical heating means surrounding said inner sleeve, insulation surrounding both the heating means and the inner sleeve and an outer sleeve, the inner sleeve comprising a first material having a first heat conductivity and being resistant to temperatures of at least 1200° C. and provided with connecting means to engage the upper part of a support sleeve arranged around the inner sleeve at said lower end of the inner sleeve, a lower part of said support sleeve resting on said support structure, said support sleeve comprising a second material having a second heat conductivity, said second heat conductivity being lower than said first heat conductivity.

2. A furnace according to claim 1, wherein said inner sleeve comprises a SiC material.

3. A furnace according to claim 1, wherein said support sleeve comprises a quartz material.

4. A furnace according to claim 1, wherein said support structure comprises a cooled support plate.

5. A furnace according to claim 1, wherein a receiving member for the wafers to be processed is provided inside the inner sleeve, said receiving member being displacable in a vertical direction for loading/unloading of said wafer.

6. A furnace according to claim 5, wherein said wafer receiving member comprises a heat shield.

7. A furnace according to claim 1, wherein a collar is provided on which the lower end of the inner sleeve bears, said collar being connected to the support structure.

8. A vertical furnace according to claim 7, wherein temperature compensating means are provided between the collar means and the support structure.

9. A vertical furnace for processing wafers positioned on a support structure, said furnace comprising an inner sleeve, having a removable lid either at its lower end or upper end, wherein the other end is provided with closing means, electrical heating means surrounding said inner sleeve, insulation, surrounding both the heating means and the inner sleeve and an outer sleeve, the inner sleeve comprising a SiC material being resistant to temperatures of at least 1200° C. wherein between the lower end of the inner sleeve and the support structure a collar of a quartz material is provided.

10. A furnace according to claim 9, wherein the inner sleeve is provided with connection means to engage the upper end of a support sleeve arranged around the inner sleeve at a lower end of the inner sleeve, the lower end of said support sleeve resting on said support structure.

11. A furnace according to claim 10, wherein temperature compensating means are provided between the supporting structure and the mounting of the collar.

* * * * *